United States Patent
Georgiev

(10) Patent No.: US 10,048,473 B2
(45) Date of Patent: Aug. 14, 2018

(54) SUBMICRON WAFER ALIGNMENT

(71) Applicant: QUALCOMM Incorporated, San Diego, CA (US)

(72) Inventor: Todor Georgiev Georgiev, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 164 days.

(21) Appl. No.: 15/188,717

(22) Filed: Jun. 21, 2016

(65) Prior Publication Data

US 2017/0038562 A1    Feb. 9, 2017

Related U.S. Application Data

(60) Provisional application No. 62/202,120, filed on Aug. 6, 2015.

(51) Int. Cl.
*G02B 13/00* (2006.01)
*G01B 11/14* (2006.01)
(Continued)

(52) U.S. Cl.
CPC .......... *G02B 13/0085* (2013.01); *B32B 7/005* (2013.01); *G01B 11/14* (2013.01);
(Continued)

(58) Field of Classification Search
CPC ..... H01L 27/14625; G02B 7/00; G02B 7/003; G02B 13/0085; G02B 27/32; G02B 27/62;
(Continued)

(56) References Cited

U.S. PATENT DOCUMENTS 3,690,881 A   9/1972 King
4,777,528 A   10/1988 Mehrens et al.
(Continued)

FOREIGN PATENT DOCUMENTS

DE   102005016231 A1   10/2006
EP   2943768 A2   11/2015
(Continued)

OTHER PUBLICATIONS

International Search Report and Written Opinion—PCT/US2016/039096—ISA/EPO—Sep. 28, 2016.
(Continued)

*Primary Examiner* — Gordon J Stock, Jr.
(74) *Attorney, Agent, or Firm* — Knobbe, Martens, Olson & Bear, LLP

(57) ABSTRACT

Certain aspects relate to systems and techniques for submicron alignment in wafer optics. One disclosed method of alignment between wafers to produce an integrated lens stack employs a beam splitter (that is, a 50% transparent mirror) that reflects the alignment mark of the top wafer when the microscope objective is focused on the alignment mark of the bottom wafer. Another disclosed method of alignment between wafers to produce an integrated lens stack implements complementary patterns that can produce a Moiré effect when misaligned in order to aid in visually determining proper alignment between the wafers. In some embodiments, the methods can be combined to increase precision.

10 Claims, 12 Drawing Sheets

(51) Int. Cl.
*H01L 27/146* (2006.01)
*G02B 7/00* (2006.01)
*B32B 7/00* (2006.01)
*G02B 27/62* (2006.01)
*G02B 27/32* (2006.01)
*G02B 27/14* (2006.01)
*G02B 27/10* (2006.01)

(52) U.S. Cl.
CPC ............. *G02B 7/003* (2013.01); *G02B 27/32* (2013.01); *G02B 27/62* (2013.01); *H01L 27/14625* (2013.01); *H01L 27/14632* (2013.01); *B32B 2307/412* (2013.01); *B32B 2551/00* (2013.01); *B32B 2559/00* (2013.01); *G02B 27/1073* (2013.01); *G02B 27/144* (2013.01)

(58) Field of Classification Search
CPC .. G02B 27/1073; G02B 27/144; G01B 11/14; B32B 7/005; B32B 2559/00; B32B 2551/00; B32B 2307/412
See application file for complete search history.

(56) References Cited

U.S. PATENT DOCUMENTS

| | | | | |
|---|---|---|---|---|
| 6,124,974 | A * | 9/2000 | Burger | G02B 3/0056 359/621 |
| 6,515,800 | B1 * | 2/2003 | Border | G02B 3/005 349/95 |
| 7,145,860 | B2 * | 12/2006 | Kouchiyama | G02B 5/005 369/112.23 |
| 7,187,501 | B2 * | 3/2007 | Wakisaka | G02B 3/0031 359/622 |
| 7,741,652 | B2 * | 6/2010 | Lee | G02B 7/02 257/432 |
| 7,796,337 | B2 * | 9/2010 | Chang | B29D 11/00365 359/619 |
| 8,023,208 | B2 * | 9/2011 | Shyu | G02B 13/001 359/619 |
| 8,789,285 | B2 * | 7/2014 | Wada | G02B 7/022 33/613 |
| 8,792,044 | B2 * | 7/2014 | Imai | G02B 13/001 348/335 |
| 8,836,942 | B2 * | 9/2014 | Quan | G01B 11/27 348/95 |
| 9,164,358 | B2 * | 10/2015 | Rudmann | G02B 6/0011 |
| 9,272,449 | B2 * | 3/2016 | Yu | B29C 43/021 |
| 9,939,605 | B2 * | 4/2018 | Georgiev | G06T 7/73 |
| 2003/0231400 | A1 * | 12/2003 | Frosig | G02B 3/0056 359/619 |
| 2004/0008417 | A1 * | 1/2004 | Shimizu | B29D 11/00278 359/619 |
| 2006/0199085 | A1 | 9/2006 | Hansen | |
| 2007/0115483 | A1 | 5/2007 | Oak et al. | |
| 2008/0136955 | A1 | 6/2008 | Kathman et al. | |
| 2008/0266561 | A1 | 10/2008 | Kandel et al. | |
| 2009/0161106 | A1 | 6/2009 | Shin et al. | |
| 2010/0195102 | A1 | 8/2010 | Den Boef | |
| 2011/0063722 | A1 * | 3/2011 | Shyu | B29C 66/1122 359/355 |
| 2012/0219251 | A1 | 8/2012 | Kuroda et al. | |
| 2015/0226547 | A1 | 8/2015 | Derichs | |
| 2015/0338618 | A1 * | 11/2015 | Tanigawa | B29C 33/40 359/642 |
| 2016/0011075 | A1 | 1/2016 | Maluck et al. | |
| 2017/0038552 | A1 | 2/2017 | Georgiev | |

FOREIGN PATENT DOCUMENTS

| | | |
|---|---|---|
| JP | 2002072078 A | 3/2002 |
| JP | 2002122412 A | 4/2002 |
| JP | 2013205702 A | 10/2013 |
| KR | 100631989 B1 | 9/2006 |
| KR | 101403469 B1 | 6/2014 |
| WO | WO-2014098075 A1 | 6/2014 |
| WO | WO-2015027123 A1 | 2/2015 |

OTHER PUBLICATIONS

Li N., et al., "Sub-20-nm Alignment in Nanoimprint Lithography Using Moire Fringe," Nano Letters, 2006, vol. 6 (11), pp. 2626-2629.

* cited by examiner

SUBMICRON WAFER ALIGNMENT

CROSS-REFERENCE TO RELATED APPLICATIONS

The present application claims the benefit of U.S. Patent Application No. 62/202,120 filed Aug. 6, 2015, entitled "SUBMICRON WAFER ALIGNMENT" and assigned to the assignee hereof, and is related to U.S. patent application Ser. No. 15/188,635 filed on Jun. 21, 2016, entitled "SUBMICRON WAFER ALIGNMENT" the contents of which are hereby incorporated by reference herein.

TECHNICAL FIELD

The systems and methods disclosed herein are directed to wafer level optics, and, more particularly, to usage of a beam splitter and/or patterns that can produce the moiré effect to aid in submicron alignment of optical wafer stacks.

BACKGROUND

A wafer-level camera is a camera having a small footprint that can be utilized in electronic devices having a thin form factor, for example a mobile phone, notebook computer, tablet computer, and the like. Such wafer-level cameras include optics to form an image and an image sensor for sensing the image. To form a high quality image, the optics of the camera module may include several lenses, sometimes separated by spacers, that require precise alignment.

However, a wafer level camera is defined by the method of manufacturing and not by the usage. The wafer-level camera is typically manufactured by stacking and bonding wafers having optical components using alignment and bonding techniques similar to semiconductor manufacturing. For example, a sensor wafer having a number of image sensors arranged in an array or grid pattern may be provided first, possibly with a cover glass layer for protection of the sensor substrate. A spacer wafer may be placed on the image sensor wafer having a number of openings, each aligned with one of the image sensors. A wafer having a number of lenses, known as a lens plate, is then placed on the spacer wafer such that each lens is aligned with one of the image sensors. A second spacer wafer may be provided before a second lens plate having a number of lenses is placed on the wafer stack. In this manner, multiple spacer wafers and multiple lens plates may be included in the manufacturing of wafer-level cameras. Finally, the stacked wafers are bonded and diced into individual wafer-level cameras each having an image sensor and a stack of spacers and lenses.

Such manufacturing techniques can also be implemented using lens plates and spacer wafers without necessarily including the sensor wafer in order to produce an integrated lens stack.

SUMMARY

Alignment of a stack of optical wafers using standard alignment techniques borrowed from contact photolithography, for example using an MA8 SÜSS mask aligner, can lead to the following problem: the wafers need to be optically aligned based on marks present on each of the wafers, and such marks need to be aligned with one another based on microscope observation. However, microscopes typically have a small depth of field and thus, due to the vertical displacement between the upper surfaces of the top and bottom wafer that bear the alignment markers, the microscope cannot focus on both marks at the same time if the upper surfaces of the top and bottom wafers are more than a few microns apart.

One solution that is attempted to overcome the problem above is to (1) focus on the mark on the top wafer and take a picture, (2) move the microscope down and focus on the mark on the lower wafer positioned under the top wafer (where top and lower refer to positioning relative to the microscope), and (3) compare the two pictures to estimate the displacement between the wafers. The displacement can be used to compensate for misalignment between the wafer and the mask. However, one problem with this method is that both marks are not viewed at the same time, which makes the process slow and inconvenient. Another, more serious problem with this method is that the microscope may not be moving in direction exactly perpendicular to the wafer, which introduces systematic error in all measurements, resulting in inaccurate displacement estimation. Thus, after compensation, the wafers may be believed to be aligned, when in fact they are not. Using a large depth of field microscope objectives can resolve this problem, but the magnification of such objectives is low field of view is gained at the expense of precise alignment, this time because small marks are not visible.

The aforementioned problems, among others, are addressed in some embodiments by the disclosed systems and methods for submicron wafer alignment. As used herein, "submicron wafer alignment" refers to alignment of wafers within tolerances of less than one micron. One disclosed method of alignment between wafers employs a beam splitter (that is, a 50% transparent mirror) that reflects the top wafer mark and makes it appear at a larger distance than it actually is. Another disclosed method of alignment between wafers implements complementary patterns to aid in visually determining proper alignment between the wafer and the mask. In some implementations, the beam splitter and complementary patterns can be used together.

Accordingly, one aspect relates to an optical wafer stack comprising a first transparent wafer including at least a first lens; a second transparent wafer including at least a second lens; a first spacer wafer positioned between the first transparent wafer and the second transparent wafer and including at least a first cell comprising a first perimeter around a first opening, the first lens and the second lens protruding at least partially into the first opening; a first alignment mark provided on the first transparent wafer; a second alignment mark provided on the second transparent wafer; and a first beam splitter layer disposed on a surface of the first spacer layer at a midpoint between an optical path between the first alignment mark and the second alignment mark.

In some implementations, the beam splitter layer can be positioned orthogonally to the optical path between the first alignment mark and the second alignment mark. The first lens, the second lens, and the first perimeter can form a lens stack having an optical axis. When the first alignment is aligned with the second alignment mark from a top-down perspective, a center of the first lens and a center of the second lens can align with the optical axis of the lens stack within a tolerance of 2 microns, or within a tolerance of 1 micron.

The first alignment mark can comprise a first set of repeating marks, and the second alignment mark can comprise a second set of repeating marks complementary to the first set of repeating marks. When the first alignment mark is aligned with the second alignment mark from a top-down perspective, a center of the first lens and a center of the second lens can align with the optical axis of the lens stack within a tolerance of 250 nm. The first set of repeating marks and the second set of repeating marks can comprise concentric annuli having a line thickness of 5 μm.

The optical wafer stack can further comprise, in some implementations, a third transparent wafer including at least a third lens; a second spacer wafer positioned between the second transparent wafer and the third transparent wafer and including at least a second opening, the second lens and the third lens protruding at least partially into the second opening; a third alignment mark provided on the third transparent wafer; and a second beam splitter layer disposed on a surface of the second spacer layer at a midpoint between an optical path between the second alignment mark and the third alignment mark.

The optical wafer stack can further comprise, in some implementations, a third transparent wafer including at least a third lens; a second spacer wafer positioned between the second transparent wafer and the third transparent wafer and including at least a second opening, the second lens and the third lens protruding at least partially into the second opening; a third alignment mark provided on the third transparent wafer; a fourth alignment mark provided on the second transparent wafer; and a second beam splitter layer disposed on a surface of the second spacer layer at a midpoint between an optical path between the third alignment mark and the fourth alignment mark.

Another aspect relates to a method of aligning transparent wafers, the method comprising disposing a first alignment mark on a first transparent wafer; disposing a second alignment mark on a second transparent wafer; disposing a beam splitter layer at an optical midpoint between the first alignment mark and the second mark; focusing a microscope objective on the second alignment mark; viewing the second alignment mark as well as a reflection of the first alignment mark via the beam splitter layer; and aligning the first transparent wafer to the second transparent wafer using overlap of the first alignment mark and the second alignment mark viewed through the microscope objective.

The method can further include exposing both a portion of the first transparent wafer including the first alignment mark and a second portion of the second transparent wafer including the second alignment mark to green, blue, or infrared light; and viewing the green, blue, or infrared light reflected off of the first alignment mark and the second alignment mark through the microscope objective. The focusing, viewing, and aligning can be performed programmatically by one or more physical computing devices. The first alignment mark can comprise a first set of repeating marks and the second alignment mark can comprise a second set of repeating marks complementary to the first set of repeating marks; and aligning the first transparent wafer to the second transparent wafer can comprise eliminating a moiré effect produced by misalignment of the first set of repeating marks with the second set of repeating marks.

Another aspect relates to non-transitory computer-readable media configured with computer-executable instructions that, when executed, cause a hardware processor to focus a microscope objective beyond a first alignment mark disposed on a first transparent wafer and beyond a beam splitter layer to focus on a second alignment mark disposed on a second transparent wafer, the first transparent wafer positioned between the microscope objective and the second transparent wafer and the beam splitter layer positioned at an optical midpoint between the first alignment mark and the second alignment mark; receive image data captured through the microscope objective, the image data representing the second alignment mark as well as a reflection of the first alignment mark via the beam splitter layer; identify, in the image data, a pattern formed by overlap of the first alignment mark and the second alignment mark; and based at least partly on the pattern formed by the overlap, output one of alignment instructions or a proper alignment determination.

The non-transitory computer-readable media can further have stored thereon instructions that, when executed, cause the hardware processor to compare the pattern formed by the overlap to a plurality of patterns stored in a data repository. The non-transitory computer-readable media can further have stored thereon instructions that, when executed, cause the hardware processor to identify a match between the pattern formed by the overlap and a proper alignment pattern of the plurality of patterns and, in response, outputting the proper alignment determination.

The non-transitory computer-readable media can further have stored thereon instructions that, when executed, cause the hardware processor to identify a match between the pattern formed by the overlap and a misalignment pattern of the plurality of patterns. The non-transitory computer-readable media can further have stored thereon instructions that, when executed, cause the hardware processor to, in response to identifying the match between the pattern formed by the overlap and the misalignment pattern, generate and output the alignment instructions. The non-transitory computer-readable media can further have stored thereon instructions that, when executed, cause the hardware processor to generate the alignment instructions via retrieving a realignment vector associated with the misalignment pattern.

Another aspect relates to an optical wafer stack comprising a first transparent wafer comprising a first array of lenses; a second transparent wafer comprising a second array of lenses, each lens of the second array of lenses forming a lens pair with a corresponding one of the first array of lenses; a first spacer wafer positioned between the first transparent wafer and the second transparent wafer and comprising a spacer material including an array of openings, at least one lens of each lens pair extending into an opening of the array of openings; a first alignment mark provided on the first transparent wafer, the first alignment mark comprising a first set of repeating marks positioned around a first lens of the first array of lenses; and a second alignment mark provided on the second transparent wafer, the second alignment mark comprising a second set of repeating marks complementary to the first set of repeating marks and positioned around a second lens of the second array of lenses, the first lens and the second lens forming one lens pair.

In some implementations, the first set of repeating marks comprises a first set of concentric annuli and the second set of repeating marks comprises a second set of concentric annuli. When the first alignment mark is aligned with the second alignment mark, the first and second sets of concentric annuli can form a continuous circular shape when viewed from a top-down perspective orthogonal to a surface of the first transparent wafer.

The first lens, the second lens, and a portion of the spacer material around an opening of the array of openings can form a lens stack having an optical axis. When the first alignment mark is aligned with the second alignment mark from a top-down perspective, a center of the first lens and a center of the second lens can align with the optical axis of the lens stack within a tolerance of 2 microns. The optical wafer stack can further comprise a beam splitter layer provided at an optical center point between a first plane of the first alignment mark and a second plane of the second alignment mark. When the first alignment mark is aligned with the second alignment mark from a top-down perspective, a center of the first lens and a center of the second lens can align with the optical axis of the lens stack within a tolerance of 250 nm. The first set of repeating marks and the second set of repeating marks can comprise concentric annuli having a line thickness of 5 µm.

The optical wafer stack can further comprise, in some implementations, a third transparent wafer including a third array of lenses; a second spacer wafer positioned between the second transparent wafer and the third transparent wafer and comprising the spacer material including an array of openings; and a third alignment mark provided on the third transparent wafer, the third alignment mark comprising a third set of repeating marks complementary to the first and second sets of repeating marks and positioned around a third lens of the third array of lenses, the third lens forming an optical stack with the first lens and the second lens.

The optical wafer stack can further comprise, in some implementations, a third transparent wafer including a third array of lenses; a second spacer wafer positioned between the second transparent wafer and the third transparent wafer and comprising the spacer material including an array of openings; a third alignment mark provided on the third transparent wafer, the third alignment mark comprising a third set of repeating marks positioned around a third lens of the third array of lenses, the third lens forming a pair with a fourth lens of the second array of lenses; a fourth alignment mark provided on the second transparent wafer, the fourth alignment mark comprising a fourth set of repeating marks complementary to the third set of repeating marks and positioned around the fourth lens.

Another aspect relates to a method of aligning transparent wafers, the method comprising disposing a first set of repeating marks around a first lens of a first array of lenses of a first transparent wafer; disposing a second set of repeating marks around a second lens of a second array of lenses of a second transparent wafer, the second set of repeating marks complementary to the first set of repeating marks; viewing the second set of repeating marks through the first transparent wafer as well as the first set of repeating marks; and aligning the first transparent wafer to the second transparent wafer using overlap of the first and second sets of repeating marks.

In some implementations, the viewing can comprise capturing image data of the first and second sets of repeating marks, and the aligning can comprise comparing, via a hardware processor, the image data to at least one template image to determine whether the first and second sets of repeating marks are aligned.

Some implementations of the method can further comprise disposing a beam splitter layer at an optical midpoint between the first and second sets of repeating marks; focusing a microscope objective on the second set of repeating marks; viewing the second set of repeating marks as well as a reflection of the first set of repeating marks via the beam splitter layer; and aligning the first transparent wafer to the second transparent wafer using overlap of the first and second sets of repeating marks viewed through the microscope objective. The focusing, viewing, and aligning can be performed programmatically by one or more physical computing devices and/or hardware processors.

Some implementations of the method can further comprise exposing both a portion of the first transparent wafer including the first alignment mark and a second portion of the second transparent wafer including the second alignment mark to green, blue, or infrared light; and capturing an image of the green, blue, or infrared light reflected off of the first alignment mark and the second alignment mark through the microscope objective. Aligning the first transparent wafer to the second transparent wafer can comprise eliminating a moiré effect produced by misalignment of the first set of repeating marks with the second set of repeating marks.

Another aspect relates to a non-transitory computer-readable media configured with computer-executable instructions that, when executed, cause a hardware processor to focus an image capture system to view a first set of repeating marks around a first lens of a first array of lenses of a first transparent wafer and a second set of repeating marks around a second lens of a second array of lenses of a second transparent wafer, the second set of repeating marks complementary to the first set of repeating marks; receive image data from the image capture system, the image data representing the first and second sets of repeating marks; identify, in the image data, a pattern formed by overlap of the first and second sets of repeating marks; compare the pattern formed by the overlap to a plurality of pattern templates stored in a data repository; in response to determining that the pattern formed by the overlap matches an aligned pattern template of the plurality of pattern templates, output a proper alignment determination; and in response to determining that the pattern formed by the overlap matches a moiré effect pattern of the plurality of pattern templates, output alignment instructions.

The non-transitory computer-readable media can further have stored thereon instructions that, when executed, cause the hardware processor to generate the alignment instructions via retrieving a realignment vector associated with the misalignment pattern. The non-transitory computer-readable media can further have stored thereon instructions that, when executed, cause the hardware processor to focus a microscope objective on the second set of repeating marks. The image data can include the representation of the first set of repeating marks via a beam splitter layer disposed at an optical center point between the first and second repeating marks.

BRIEF DESCRIPTION OF THE DRAWINGS

The disclosed aspects will hereinafter be described in conjunction with the appended drawings and appendices, provided to illustrate and not to limit the disclosed aspects, wherein like designations denote like elements.

DETAILED DESCRIPTION

Introduction

Embodiments of the disclosure relate to systems and techniques for submicron alignment in wafer optics. One disclosed method of alignment between wafers to produce an integrated lens stack employs a beam splitter (that is, a 50% transparent mirror) that reflects the alignment mark of the top wafer when the microscope objective is focused on the alignment mark of the bottom wafer. Another disclosed method of alignment between wafers to produce an integrated lens stack implements complementary patterns that can produce a Moiré effect when misaligned in order to aid in visually determining proper alignment between the wafers. In some embodiments, the methods can be combined to increase precision.

In some examples, the alignment features described herein can be visually inspected by a user and the wafers can be manually aligned by the user, for example by the user manually controlling mechanical alignment features. In other examples, the alignment features can be observed automatically via captured image data including one or both of still images and videos, and the wafers can be automatically aligned by a computing system capable of analyzing the image data, identifying wafer displacement, and controlling mechanical alignment features.

As used herein, the term "wafer" refers to optical wafers, for example glass or other optical material. Such optical wafers can be approximately 8 inches in diameter and approximately 500 microns thick in some embodiments. However, it will be appreciated that the disclosed submicron wafer alignment techniques could be useful in other fields in addition to wafer-level optics, for example photolithography and semiconductor manufacturing. In such cases the wafers being aligned can be a mask or photomask, as well as any semiconductor material or substrate suitable for photolithography techniques, for example a bulk silicon wafer, epitaxial wafer, or SOI (Silicon-on-Insulator) wafer.

Various embodiments will be described below in conjunction with the drawings for purposes of illustration. It should be appreciated that many other implementations of the disclosed concepts are possible, and various advantages can be achieved with the disclosed implementations.

Overview of Example Wafer Stacks

Figure 1A:
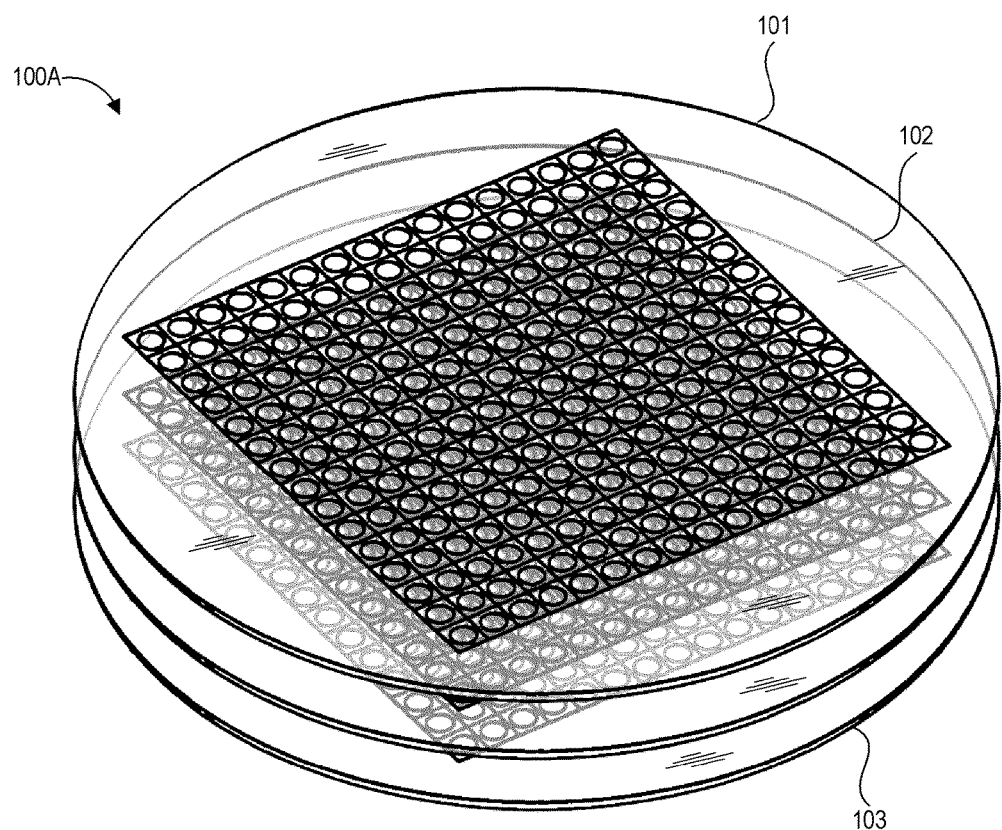
FIG. 1A illustrates an example of a top wafer, a spacer wafer, and a bottom wafer for alignment.

FIG. 1A illustrates an example stack 100A of a top wafer 101, a spacer wafer 102, and a bottom wafer 103 for alignment.

As illustrated, each of the top wafer 101, spacer wafer 102, and bottom wafer 103 includes a grid of optical components surrounded by a perimeter of the transparent wafer. Other embodiments than the one illustrated can have differently shaped and sized grids of optical components with or without a surrounding perimeter. For example, each of the top wafer 101 and bottom wafer 103 can include, for each cell of the grid of optical components, a lens on one or both of a top surface of the wafer and a bottom surface of the wafer. The spacer wafer 102 can include, for each cell of the grid of optical components, an aperture or hole slightly larger than and aligned with the lens features of the corresponding cells of the top wafer 101 and bottom wafer 103, for example drilled through the spacer wafer 102. After alignment, bonding, and dicing, the corresponding cells of the stacked wafers produce an integrated lens stack 110, one example of which is shown in FIG. 1C.

The top wafer 101, spacer wafer 102, and bottom wafer 103 are illustrated before bonding, at which point alignment between the wafers takes place. In order to produce high-resolution images for consumer imaging devices including cameras having, for example, 8 megapixels or more, the alignment of such wafers requires precision of approximately 2 microns or better, and optimally in some embodiments precision of approximately 1 micron. Alignment refers to positioning of the center of each lens positioned along, or positioned within the predetermined tolerance of, an optical axis passing through the stack.

Figure 1B:
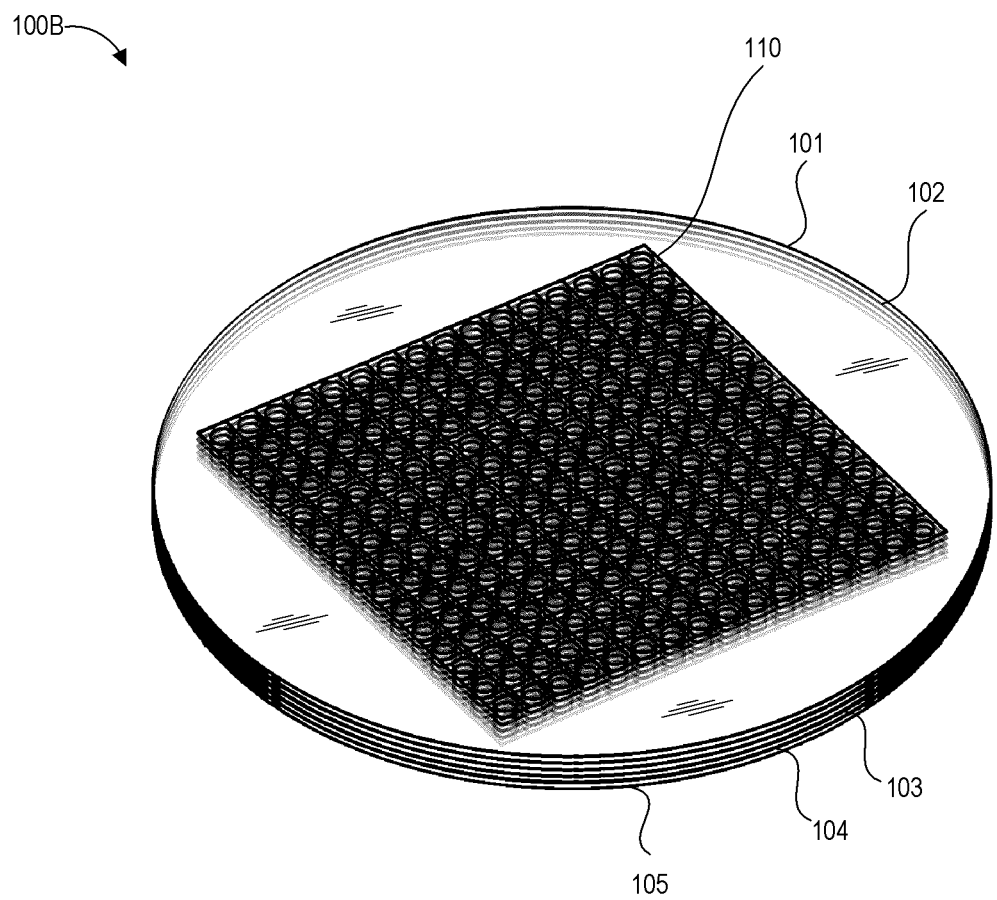
FIG. 1B illustrates an example of the top wafer, spacer wafer, and bottom wafer of FIG. 1A after alignment and bonding with each other and with an additional spacer wafer and an additional bottom wafer.

FIG. 1B illustrates an example of the top wafer 101, spacer wafer 102, and bottom wafer 103 of FIG. 1A after alignment and bonding with each other and with an additional spacer wafer 104 and an additional bottom wafer 105. One integrated lens stack 110 formed by the stack of corresponding cells in the wafers is shown in more detail in FIG. 1C. Although five wafers—three lens plates and two spacer wafers—are illustrated in the bonded stack of FIG. 1B, other embodiments may implement greater or fewer numbers of wafers, and may implement spacer and lens wafers in different configurations.

Figure 1C:
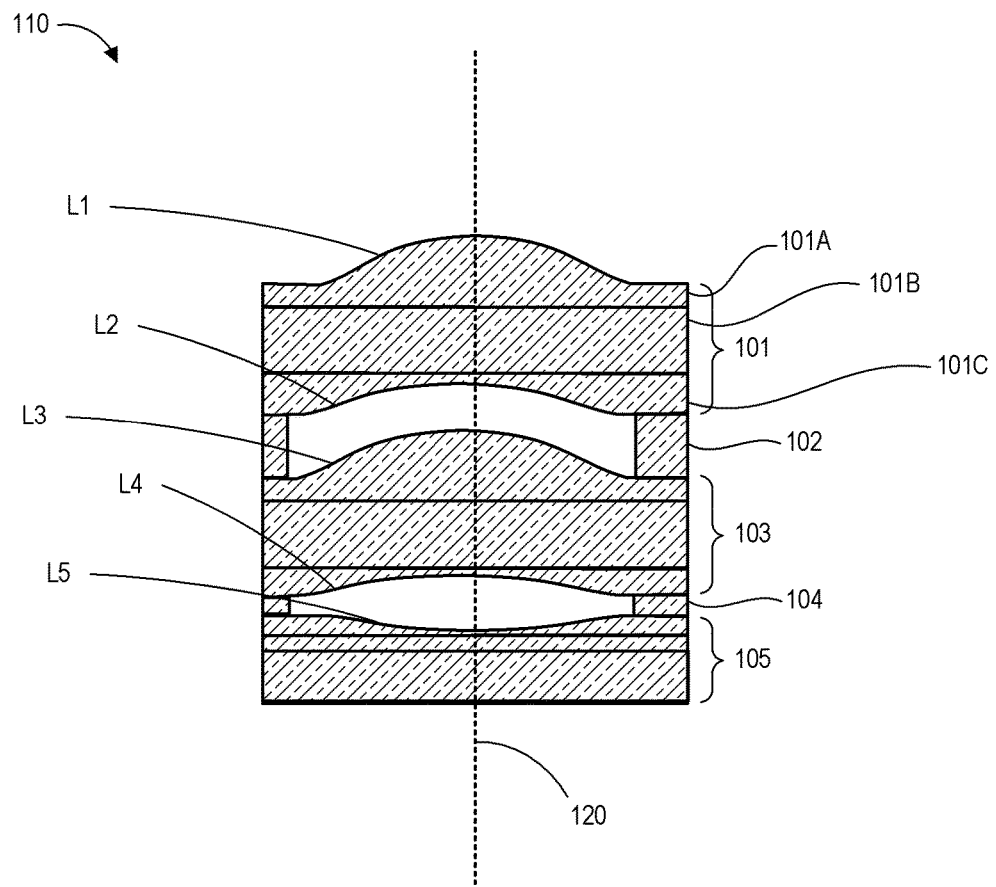
FIG. 1C illustrates a cross-sectional view of an example lens stack that can be diced from the bonded stack of FIG. 1B.

FIG. 1C illustrates a cross-sectional view of an example integrated lens stack 110 after dicing the bonded stack of FIG. 1B. In some embodiments, the diameter of the lenses in the lens stack is approximately 2 mm. As illustrated, the integrated lens stack 110 includes one cell from each of the top wafer 101, spacer wafer 102, bottom wafer 103, additional spacer wafer 104, and additional bottom wafer 105 with lenses L1, L2, L3, L4, and L5 formed on the various top and bottom surfaces of the cells of top wafer 101, bottom wafer 103, and additional bottom wafer 105. The centers of lenses L1, L2, L3, L4, and L5 can be aligned with the optical axis 120 of the integrated lens stack 110 within a tolerance of approximately 2 microns or better, and in some embodiments within a tolerance of approximately 1 micron, for example using a beam splitter layer or complementary high frequency marks as described herein. The centers of lenses L1, L2, L3, L4, and L5 can be aligned with the optical axis 120 of the integrated lens stack 110 within a tolerance of approximately 250 nm or 200 nm in some embodiments, for example using a beam splitter layer as described herein and alignment marks having a line thickness of less than or equal to one micron, or by using a beam splitter layer and complementary high frequency marks in combination as described herein. As used herein, "high frequency" may refer to a repeating pattern of marks, where the marks in the repeating pattern are closely spaced so as to produce the moiré effect when viewed in misalignment with another high frequency set of marks.

As illustrated, each of the top wafer 101, bottom wafer 103, and additional bottom wafer 105 may be formed from multiple layers of optical material. For example, top wafer 101 is depicted as having a substantially flat central layer 101B, a first lens layer 101A having a positive lens provided on one surface of the substantially flat central layer 101B, and a second lens layer 101C having a negative lens provided on an opposite surface of the substantially flat central layer 101B. These optical layers may be aligned using the disclosed beam splitter layer and/or complementary marks techniques to form top wafer 101 prior to alignment of and bonding of top wafer 101 with spacer layer 102 bottom wafer 103. Bottom wafer 103 is depicted as having a similar structure as top wafer 101 while additional bottom wafer 105 is depicted with two substantially flat layers and one negative lens layer, and similarly the layers of bottom wafer 103 and additional bottom wafer 105 may be aligned using the disclosed beam splitter layer and/or complementary marks techniques to form these wafers prior to alignment and bonding of the integrated lens stack 110.

Overview of Alignment Using Beam Splitter

Figure 2A:
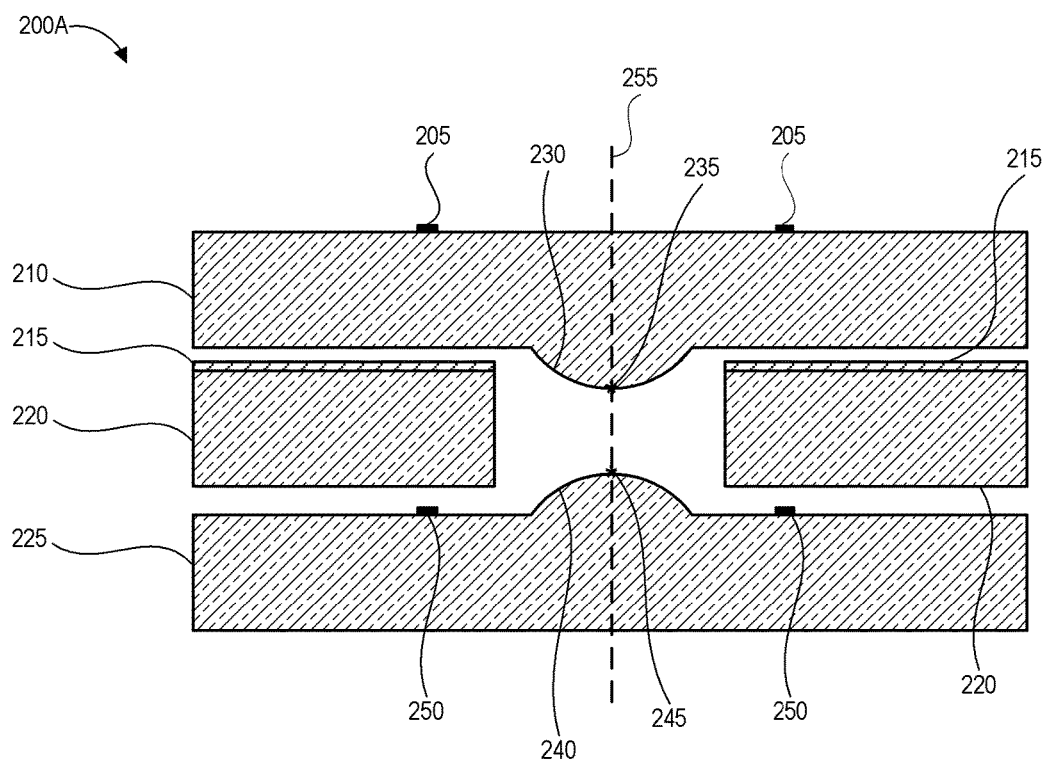
FIG. 2A illustrates an example of wafer alignment features implementing a beam splitter layer.

As illustrated in FIG. 2A, one method of aligning wafers for a stack 200A can be implemented using a beam splitter layer 215 (for example, a 50% transparent mirror) that reflects the top wafer mark 205 provided on top wafer 210 and makes it appear at a larger distance than it actually is. At least top wafer 210 and spacer wafer 220 can be comprised of a transparent material. By focusing the objective of the microscope on the bottom alignment marks and thus viewing the bottom alignment marks 250 as well as the reflection of the top alignment mark 205 provided on the bottom wafer 225 via the beam splitter, the top and bottom marks appear in the same plane and accordingly can be viewed simultaneously for precise alignment between the wafers. For example, precise alignment can refer to alignment of the centers 235, 245 of lenses 230, 240 with the optical axis 255 of the integrated lens stack 200A within a tolerance of approximately 2 microns or better, and optimally in some embodiments within a tolerance of approximately 1 micron. Much better than 1 micron precision may be achieved with the proposed method, depending on the microscope objectives used. Precise alignment can additionally or alternatively refer to alignment of the centers 235, 245 of lenses 230, 240 with the optical axis 255 of the integrated lens stack 200A to produce sufficient optical resolution for an intended purposes of the integrated lens stack 200A, for example consumer imaging devices or specialized imaging devices. As with the centers 235, 245 of lenses 230, 240, lens centers (referring to a point along an axis of rotational symmetry of the lens) are illustrated with an asterisk in the Figures, however it will be understood that this is not a structure physically included in the lenses. Alignment of the top wafer marks 205 with the bottom wafer marks 250, where alignment refers to substantial overlap of a top wafer mark 205 with the corresponding bottom wafer mark 250 from a top-down perspective (when viewed together through the upper surface of the top wafer 210), can produce the described precise alignment.

In the illustrated example, the beam splitter layer 215 is provided for use in aligning a top wafer 210, spacer wafer 220, and bottom wafer 225. The top wafer 210 and bottom wafer 225 can range from 200 microns to 500 microns in thickness in some embodiments, and the spacer wafer 220 can range from 200 microns to 500 microns in thickness in some embodiments. As an example, the gap or hole in the spacer layer 220 can be approximately 3 mm across and surrounded by a perimeter used to space the top wafer 210 from the bottom wafer 225, and the diameter of the lenses 230, 240 formed in the top and bottom wafers 205, 225 can be approximately 2 mm.

As illustrated, each of the top wafer 210 and bottom wafer 225 has two alignment marks 205, 250 on an upper surface thereof. As described in more detail below, positioning of the alignment marks 205, 250 is not limited to a specific surface of the wafers 205, 225. Due to the transparency of the materials of top wafer 210 and bottom wafer 225, the bottom alignment marks 250 can be viewed through the top wafer 210 and spacer wafer 220. Each of the top alignment marks 205 on the top wafer 210 forms a pair with a corresponding bottom alignment mark 250 on the bottom wafer 225. Although two pairs of alignment marks are required for controlling translation and rotation during alignment of the top wafer 210 and bottom wafer 225, more pairs can be provide for better precision if desired. The machines used to align the wafers can have two microscope objectives, one for observation of each of the pairs of alignment markers.

The alignment marks 205, 250 can be provided by any suitable means onto top wafer 210 and bottom wafer 225. Suitable processes may include, for example, printing processes, vacuum-based deposition processes, solution coating processes, or cure/etch processes that either form alignment marks on a wafer or form seed lines or features on the wafer that may be further processed to form the alignment marks. Printing processes may include flexographic printing, gravure printing, inkjet printing, rotary printing, or stamp printing. Deposition processes may include pattern-based deposition, chemical vapor deposition, electro deposition, epitaxy, physical vapor deposition, or casting. Cure/etch processes may include optical or UV-based photolithography, e-beam/ion-beam lithography, x-ray lithography, interference lithography, scanning probe lithography, imprint lithography, or magneto lithography. One of ordinary skill in the art will recognize that any process or combination of processes, suitable for disposing alignment marks on a wafer, may be used, for example sputtering chrome and etching it via a standard photoresist lithographic process.

In some examples, a thin layer of chromium, aluminum, or another metal can be deposited on the upper surface of the spacer layer 220 to form the beam splitter layer 215. For example, the beam splitter layer 215 may be deposited via photolithography or by any of the printing processes, vacuum-based deposition processes, solution coating processes, or cure/etch processes described above. Although not illustrated, a thin layer of epoxy or other bonding material can be present between the beam splitter and the lower surface of the top layer and also between the upper surface of the bottom layer and the lower surface of the spacer layer. In various embodiments the beam splitter layer 215 may be provided on an upper surface or lower surface of a wafer, or within a groove, etching, or recess of a layer to achieve correct positioning at the optical midpoint (a midpoint along the optical path accounting for material refractive index) between alignment markings. A beam splitter is an approximately 50% transparent mirror. There are many ways of providing the beam splitter, for example by sputtering a thin layer of chrome.

The positioning of the beam splitter layer 215 between the top alignment marks 205 and the bottom alignment marks 250 is carefully selected to be equidistant to the top alignment marks 205 and the bottom alignment marks 250 in terms of the optical path. The optical path is calculated by multiplying the index of refraction of the material through which the path passes by the geometric length of the path. Accordingly, the materials and thicknesses of the top wafer and spacer wafer affect the optical path, as well as the material, thickness, and clarity of the epoxy used to bond the wafers. Is noted that the materials may increase the optical path, which may lead to a shift in the focus of a lens, e.g., microscope objective. The focal point may change relative to where the focal point would be in vacuum. The position of the focus is moved further away from the lens proportional to the index of the material in which light travels. Thus, inside materials, which may have, for example, index $n=1.5$ or a similar value, the lenses focus further away than in vacuum (by a factor of n=1.5, in the present example). Accordingly, one may calculate where the focal point would be, then multiply this calculation by n to determine where the focal point is actually located. The distance between a lens and the its associated focal point should match in the two paths. For example, a first distance between a first lens and a first focal point (associated with the first lens in a first path) should match or be substantially be equal to a second distance between a second lens and a second focal point (associated with the second lens in a second path). Substantially equal may refer to being within a tolerance of, for example, approximately 2 microns or better, and in some embodiments within a tolerance of approximately 1 micron.

Alignment marks can be provided on either the upper surface or the lower surface of a wafer in order to aid in positioning of the beam splitter layer at the optical midpoint of the path between upper and lower alignment marks. Further, in some embodiments, one or both of the upper and lower alignment marks may be provided in a groove, recess, or etching of its respective wafer in order to provide for a beam splitter layer that is at the optical midpoint of the path between upper and lower alignment marks. As such the position of the alignment mark is not limited to the upper and lower surfaces of a wafer, but can also be provided at a position between the upper and lower surface if required for a particular wafer stack design. Similarly, a beam splitter layer can be provided in a groove, recess, or etching if required for being at the optical midpoint of the path between upper and lower alignment marks.

Due to the beam splitter configuration, at the same time that a camera or user observes the bottom alignment mark through the microscope, the camera or user also observes the top alignment mark due to the presence of the beam splitter. The two marks are at approximately equal optical paths from the objective and can be seen in focus at the same time. This resolves the orthogonality issue of previous alignment techniques because the microscope does not need to travel in any of the x, y, or z directions to view both the top and bottom alignment marks of a pair. The mirror is perfectly flat at the precision of the wafer and accordingly it reflects orthogonally. As will be understood, "perfectly flat" implies substantial flatness for enabling orthogonal (or approximately orthogonal) light reflection at points across the surface of the mirror, and in actuality the mirror may be substantially though imperfectly flat based partly on the precision of the flatness of the wafer on which it is provided and partly on the manufacturing capabilities of the specific process used for creating the mirror.

Because focusing is no longer an issue, the depth of field of the microscope objective can be smaller and thus magnification can be stronger. This makes it possible to use extremely small marks for alignment (for example, marks having a line thickness of less than or equal to one micron, in comparison to the conventionally-used 100 micron thickness marks) and to achieve unprecedented accuracy, for example down to 250 nm or even down to 200 nm, limited only by the optical resolution of the best microscope objective.

FIG. 2A illustrates only one stack during alignment, though as illustrated in FIGS. 1A and 1B each wafer can include a number of cells and thus the entire wafer stack can form a number of integrated lens stacks. The pairs of alignment marks can be provided on each lens stack of the wafers or only on one or more of the lens stacks. Further, in some embodiments the alignment features may be provided on a dedicated alignment cell in the wafer stack that does not include lens features and may include a larger gap in the spacer wafer between the top and bottom wafers, such that only the top wafer material is present between the top and bottom alignment marks. In such embodiments the beam splitter can be formed on the lower surface of the top wafer.

Overview of Alignment Using Complementary Patterns

Figure 2B:
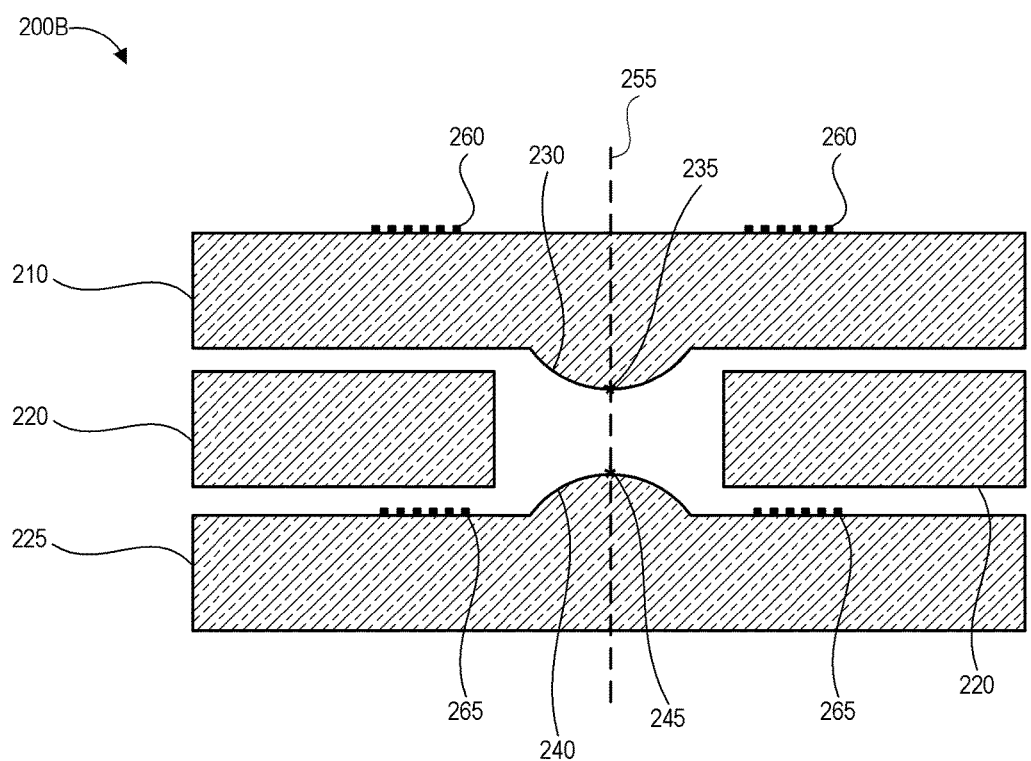
FIG. 2B illustrates an example of wafer alignment features implementing complementary annuli.

FIG. 2B illustrates alignment features that can enable submicron alignment of transparent wafers utilizing a class of high resolution marks on both the top and bottom wafer. Each of the top wafer and bottom wafer can be provided with high resolution marks such that, in optimal alignment between the top and bottom wafer, the gaps between the marks of the top wafer are filled by the marks of the bottom wafer. For example, a first number of concentric annuli can be provided on the top surface of the top wafer, and a second number of concentric annuli can be provided on the top surface of the bottom wafer. The first number of concentric annuli and second number of concentric annuli can be sized and positioned such that, in optimal alignment, when viewed from above the annuli appear to create one solid annulus having a thickness spanning of all of the annuli. When the top wafer and bottom wafer are misaligned, the complementary patterns overlay one another to produce Moiré patterns when viewed from above, thus providing a visual indication of misalignment between the wafers.

Although the high frequency mark examples provided herein are illustrated by the example of the concentric annuli, other high frequency patterns capable of producing the Moiré effect are suitable for wafer alignment, for example complementary rectangular arrays of dots, complementary vertical lines, complementary horizontal lines, and the like. Other dense, high frequency features that produce interference patterns can be used to achieve sub-micron precision.

The visual effects resulting from the overlapping of such high frequency marks can be used for alignment even without high resolution microscope, for example enabling naked-eye observation of 5 micron features due to production of moiré effects when the high resolution marks of the top and bottom wafers are overlaid in misalignment. The moiré effect is a visual perception that occurs when viewing a set of lines or dots that is superimposed on another set of lines or dots, where the sets differ in relative size, angle, or spacing and thus create an interference pattern of additional lines or artifacts. A moiré pattern is a secondary and visually evident superimposed pattern that occurs when viewing a set of lines or dots that is superimposed on another set of lines or dots, where the sets differ in relative size, angle, or spacing.

The marks can be of sub-wavelength size, for example having a thickness of 0.25 microns. The moiré effect will make low frequency fringes easily visible. The marks and visual effects that occur during alignment are discussed in more detail with respect to FIGS. 3 and 4 below.

Overview of Alignment Using Beam Splitter and Complementary Patterns

Figure 2C:
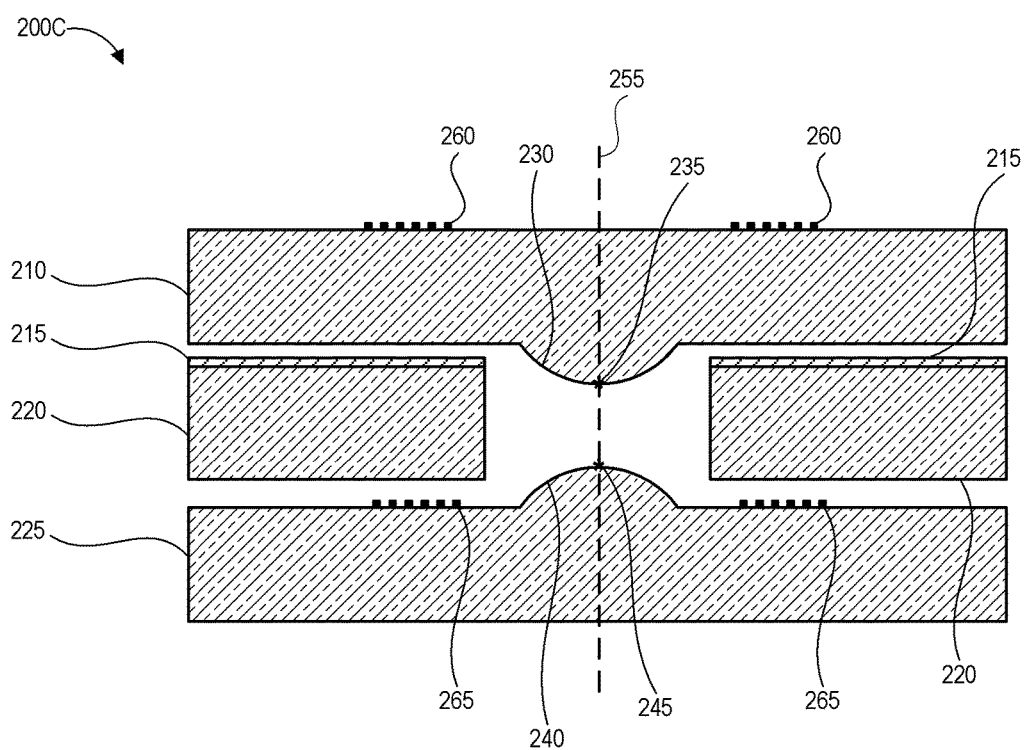
FIG. 2C illustrates an example of wafer alignment features implementing both a beam splitter layer and complementary annuli.

FIG. 2C illustrates another method for submicron alignment of transparent wafers utilizing the class of high resolution marks on both the top and bottom wafer. As described with respect to FIG. 2B, each of the top wafer and bottom wafer can be provided with high resolution marks such that, in optimal alignment between the top and bottom wafer, the gaps between the marks of the top wafer are filled by the marks of the bottom wafer. Further, a beam splitter layer as described above with respect to FIG. 2A is provided at the center of the optical path between the annuli and complementary annuli. Accordingly, the annuli and complementary annuli can be simultaneously viewed through a high-magnification microscope objective as if in the same plane.

Such a configuration can achieve 0.25 micron precision for wafer alignment in some embodiments. In some examples, using shorter wavelength light (blue or green) to illuminate the annuli and complementary annuli when viewed through the microscope can provide for precision limited only by the diffraction of the light and the capabilities of the alignment machine, possibly to providing for alignment precision of 200 nm.

Overview of Multiple Alignments

Figure 3A:
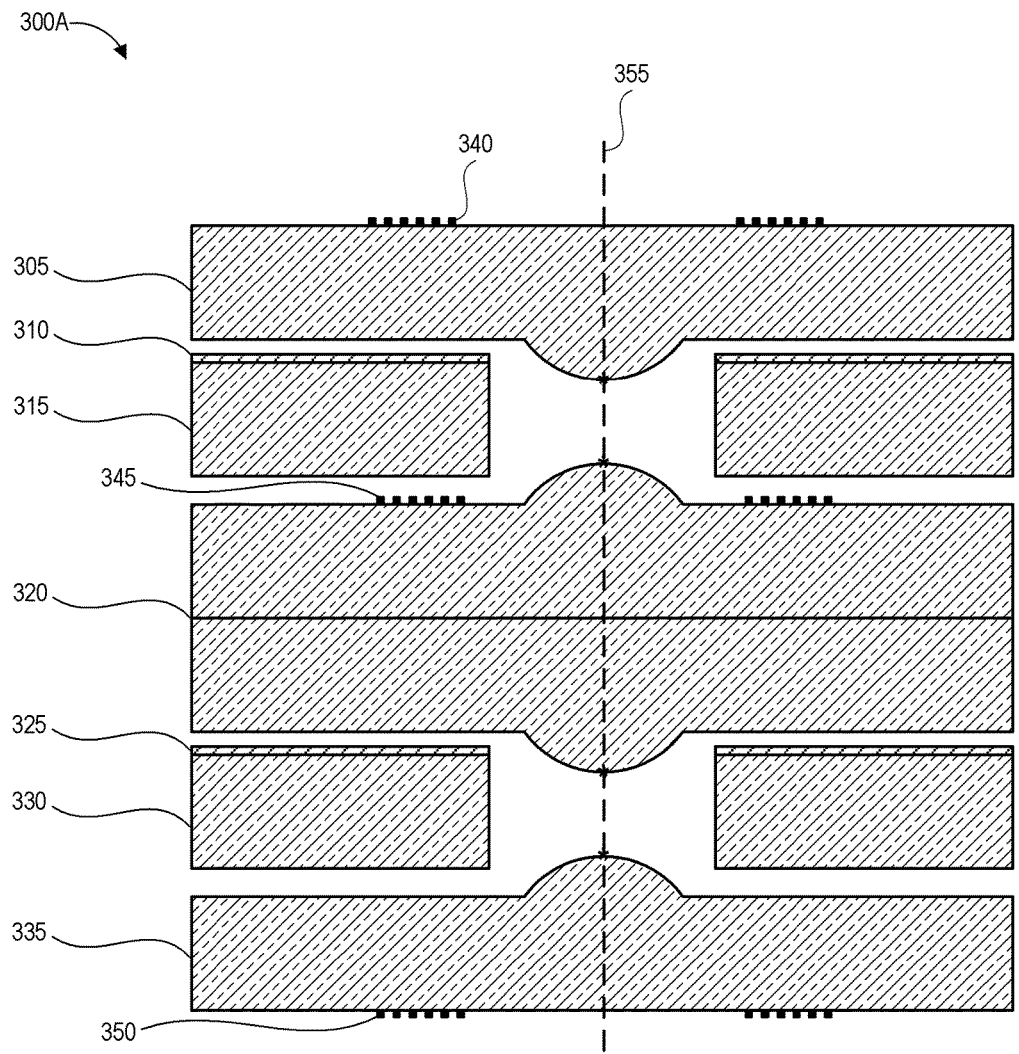
FIGS. 3A and 3B illustrate examples of wafer alignment features implementing multiple beam splitter layers in a stack.
Figure 3B:
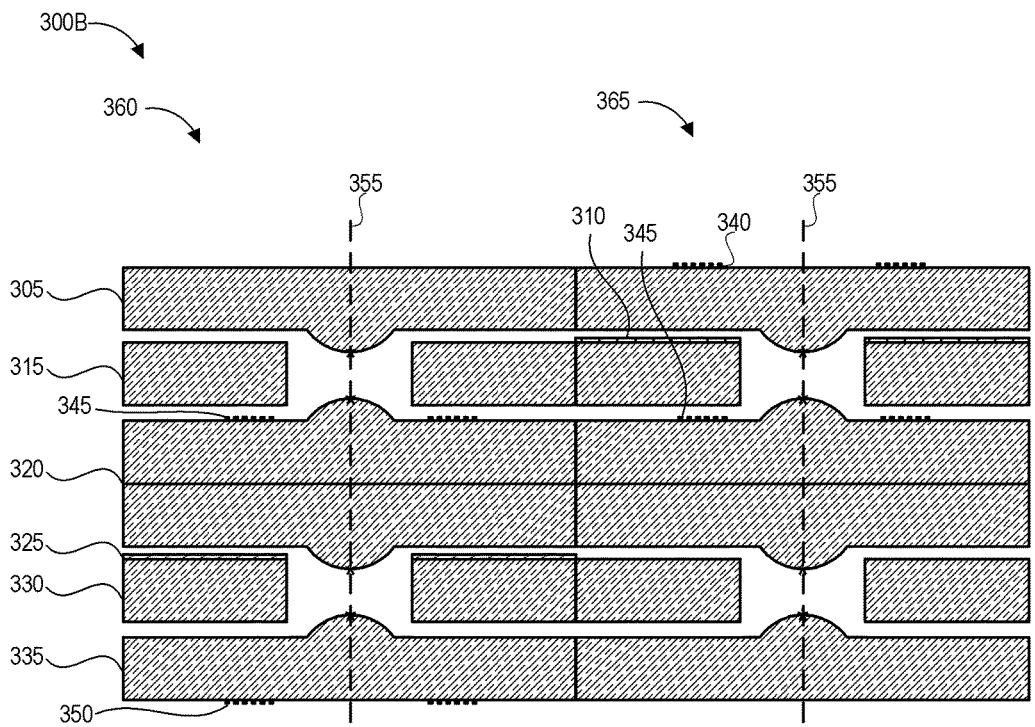

FIGS. 3A and 3B illustrates a portion of an embodiment of a wafer stack having three lens plates (top wafer 305, middle wafer 320, and bottom wafer 335) and two spacer layers 315, 330. In some embodiments, the alignment techniques discussed above with respect to FIGS. 2A-2C can be applied to stacks such as the stacks 300A, 300B shown in FIGS. 3A and 3B by providing one or both of alignment markers 340, 345, 350 on each lens plate and multiple beam splitter layers 310, 325. Either or both of the alignment markers 340, 345, 350 and multiple beam splitter layers 310, 325 can be used as described herein to align the lens centers (*) with the optical axis 355 of the stack 300A, 300B. As illustrated, alignment markers 340, 345, 350 may be sets of complementary annuli. In other embodiments, other alignment markers can be used. As described above, the beam splitter layers 310, 325 can be positioned at the midpoint of the optical path between a pair of the alignment markers 340, 345, 350 so that the pair can be viewed together at a single focal depth through the objective of a microscope.

Some embodiments of the stack 300A of FIG. 3A may be designed such that the top wafer 305, middle wafer 320, and bottom wafer 335 can be aligned with one another in a single alignment. For example, alignment markers 340, 345, 350 for each wafer in the stack can be designed to be complementary to one another, such that the top wafer 305, middle wafer 320, and bottom wafer 335 can be aligned simultaneously. As another example, the configuration of the wafers 305, 315, 320, 330, 335, alignment markers 340, 345, 350, and the beam splitter layers 310, 325 can be designed such that the alignment markers 340, 345, 350 can be viewed together at a single focal depth through the objective of a microscope.

In other embodiments, adjacent pairs of the top wafer 305, middle wafer 320, and bottom wafer 335 can be aligned separately. In some embodiments, alignment between the top wafer 305 and middle wafer 320 can be performed first, followed by an additional alignment between the middle wafer 320 and the bottom wafer 335. In other embodiments, alignment between the middle wafer 320 and the bottom wafer 335 can be performed first, followed by an additional alignment between the top wafer 305 and middle wafer 320. Such additional alignment can be performed using the same cell of the wafer stack, as shown by the stack 300A of FIG. 3A, or using a different cell of the wafer stack, as shown by the stack 300B of FIG. 3B.

FIG. 3B illustrates two cells 360, 365 of the wafer stack 300B that have different configurations of markers and beam splitter layers for alignment. A first cell 360 includes alignment markers 345, 350 on the middle wafer 320 and bottom wafer 355, respectively, and a beam splitter layer 325 on spacer layer 330 at the midpoint of the optical path between alignment markers 345, 350. As such, the alignment configuration of the first cell 360 can be used to align the middle wafer 320 and bottom wafer 355. In the illustrated embodiment, the beam splitter layer 310 on the spacer layer 315 does not extend into the first cell 360. A second cell 365 includes alignment markers 340, 345 on the top wafer 305 and middle wafer 320, respectively, and a beam splitter layer 325 on spacer layer 315 at the midpoint of the optical path between alignment markers 340, 345. As such, the alignment configuration of the second cell 365 can be used to align the op wafer 305 and middle wafer 320. In the illustrated embodiment, the beam splitter layer 325 on the spacer layer 330 does not extend into the second cell 365. Though the cells 360, 365 are depicted with both beam splitter layers and concentric annuli, it will be appreciated that, as described above, one or both of concentric annuli and beam splitter layers (with any alignment markers) can be used for alignment of the layers of stack 300B.

Additional Discussion of Alignment Using Complementary Patterns

Figure 4A:
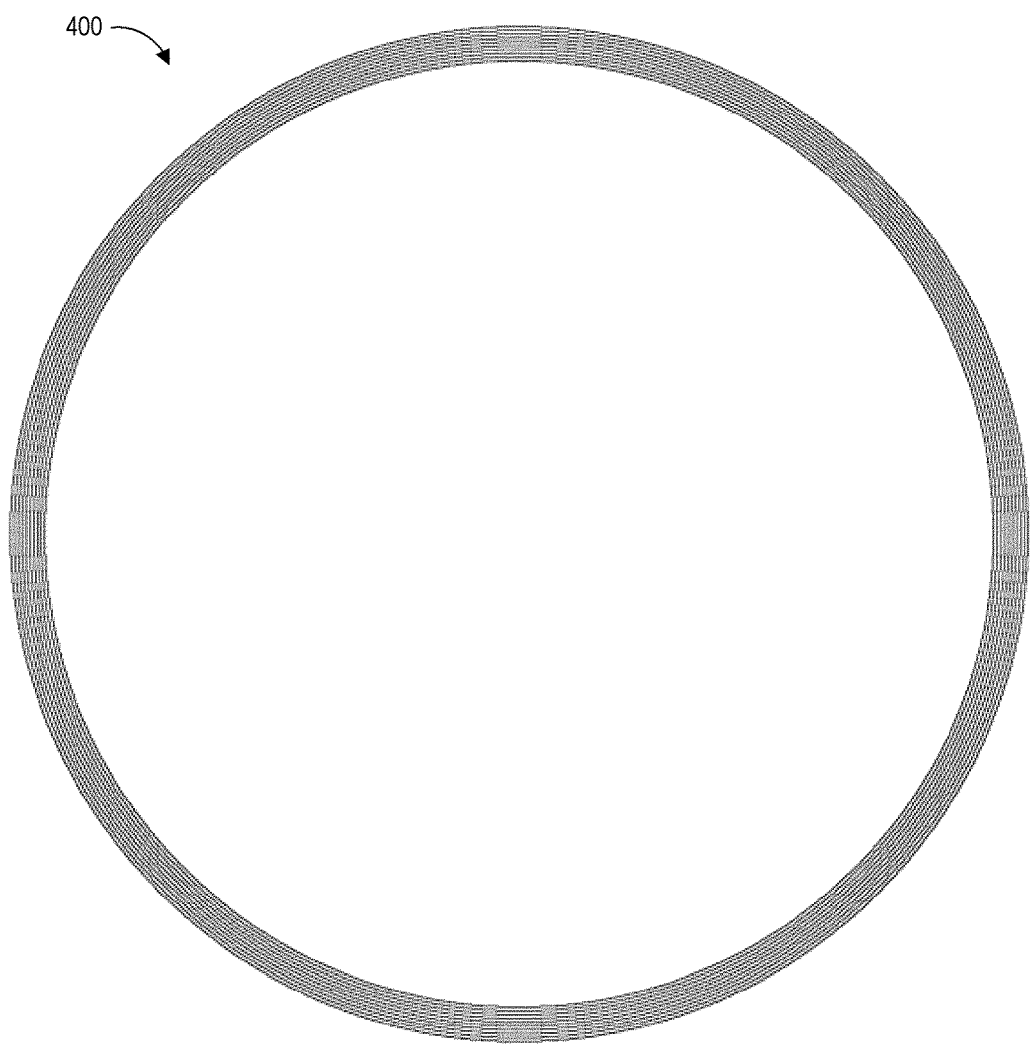
FIG. 4A illustrates an example of a single set of annuli for use as a wafer alignment feature.

FIG. 4A illustrates an example of one set of concentric annuli 400 that can be disposed on or within a first wafer for alignment. As an example, a first annulus has an inner diameter of 3 mm and thickness of 5 μm. A second annulus (not shown) concentric with the first annulus can have an inner diameter of 3.01 mm and thickness of 5 μm, and such spacing can continue for all annuli in the set. One embodiment of a set of annuli includes 10 annuli.

In some implementations, the concentric annuli can be a diffraction grating. In other implementations, the concentric annuli can be formed using chromium deposited on the first wafer. In still other implementations, the concentric annuli can be deposited, for example using photolithography, in etchings on the first wafer so as to be located at a position between opposing surfaces of the wafer. Although not shown, a complementary set is formed on a second wafer for alignment with the first wafer. Further, as discussed above, the patterns do not necessarily need to be annuli, but rather can be a wide range of shapes and sizes of periodic, high-frequency, patterns that are capable of producing the moiré effect via interference with one another.

Figure 4B:
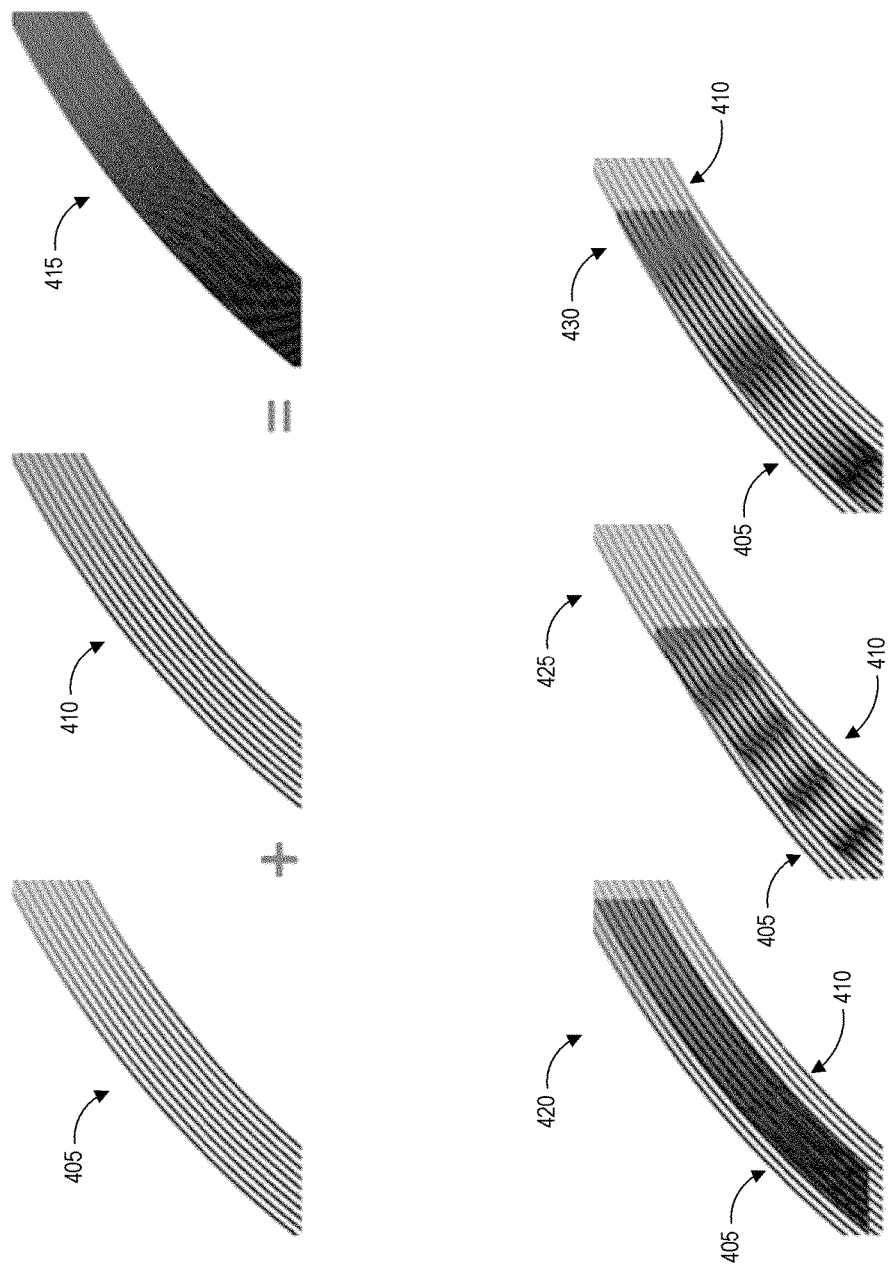
FIG. 4B illustrates various examples of overlap between a portion of a pair of alignment features including the annuli of FIG. 4A.

FIG. 4B illustrates various examples of overlap between a portion of a pair of alignment features 405, 410 like the annuli 400 described with respect to FIG. 4A. As shown in the first row, in optimal alignment a portion of the first set of annuli 405 and a portion of the second, complementary set of annuli 410 visually combine to produce the impression of a single annulus 415 having a thickness of the combination of the first set of annuli 405 and the second set of annuli 410.

As shown in the second row, various misalignments 410, 425, 430 between the portion of the first set of annuli 405 and the portion of the second, complementary set of annuli 410 visually combine to produce the indications of misalignment including moiré effect. The moiré effect is most pronounced in the misalignment of in the misalignment 412, though is still present in the misalignments 430 and 420, though to a lesser degree. Even if the first set of annuli 405 and the second, complementary set of annuli 410 are not misaligned to produce the moiré effect, visibility of distinct annuli as in misalignment 420 can visually indicate that the respective wafers require repositioning for proper alignment.

Overview of Additional Embodiments

Figure 5:
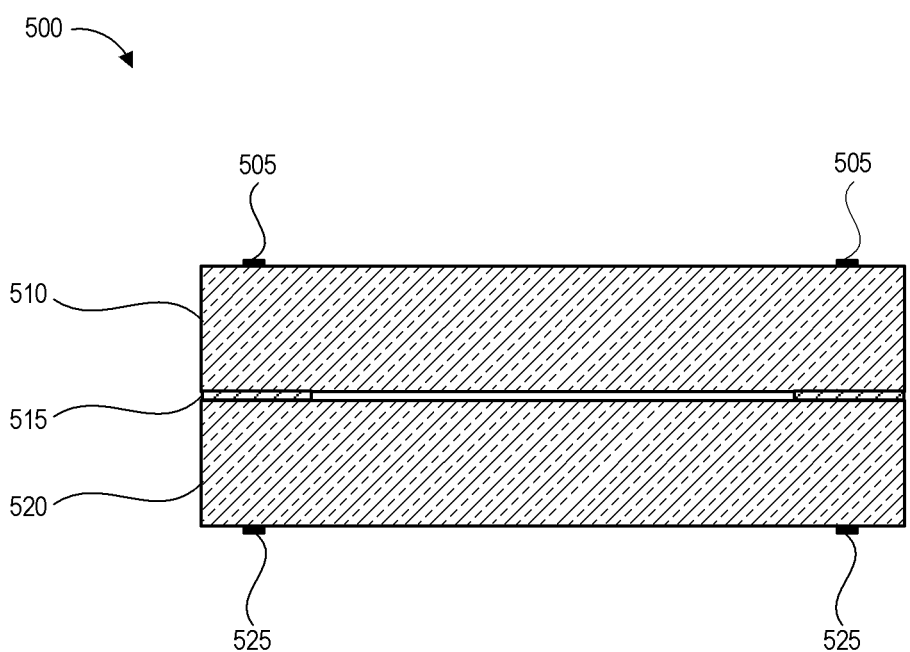
FIG. 5 illustrates an embodiment of using a beam splitter layer for alignment of two transparent wafers.

FIG. 5 illustrates an example of using a beam splitter layer 515 and alignment markings 505, 525 to align upper transparent wafer 510 and lower transparent wafer 520 in a stack 500. The beam splitter layer 515 is positioned at the midpoint of the optical path between upper alignment markings 505 and lower alignment markings 525. Though no spacer layers are illustrated, other embodiments may include spacer layers between upper transparent wafer 510 and lower transparent wafer 520, and the positioning of beam splitter layer 515, upper alignment markings 505, and lower alignment markings 525 may be adapted according to the dimensions and optical properties of the various transparent wafers and spacer wafers.

In one embodiment the upper transparent wafer 510 and lower transparent wafer 520 can be lens plates, as shown in FIGS. 1A and 1B and described above. However, the alignment techniques described herein are not limited to optical wafers, and in other embodiments upper transparent wafer 510 and lower transparent wafer 520 can be any other type of transparent wafer undergoing precise alignment. For example, upper transparent wafer 510 and lower transparent wafer 520 can be substrates for a touch-sensitive panel or display, each having a conductive pattern requiring overlay at a predetermined alignment.

In some embodiments of upper transparent wafer 510 and lower transparent wafer 520, transparent means the transmission of visible light with a transmittance rate of 85% or more. In certain embodiments, transparent wafers may be polyethylene terephthalate ("PET"), polyethylene naphthalate ("PEN"), cellulose acetate ("TAC"), cycloaliphatic hydrocarbons ("COP"), bi-axially-oriented polypropylene ("BOPP"), polyester, polycarbonate, glass, or combinations thereof. In other embodiments, transparent wafers may be any other transparent material suitable for use as a substrate or optical material. One of ordinary skill in the art will recognize that the composition of transparent wafers may vary based on an application or design.

In other embodiments, upper transparent wafer 510 and lower transparent wafer 520 may be aligned under illumination outside the visible spectrum. For example, certain materials such as silicon are transparent with respect to infrared light. Such silicon wafers can be exposed to infrared illumination, imaged using an image sensor designed for capture of infrared light, and the resulting infrared images can be used for determining alignment of the wafers 510, 520. Infrared alignment of silicon wafers can be suitable for use in photolithography, 3D integrated circuits, and microfluidics, to name a few non-limiting examples. Thus, in some embodiments transparent means transmission of light at a specific wavelength or range of wavelengths of 85% or more.

The beam splitter layer 515 can be provided across a portion of all of a surface of one of upper transparent wafer 510 and lower transparent wafer 520. As illustrated, the beam splitter layer 515 can be provided in some examples across an area between upper alignment markings 505 and lower alignment markings 525 but may not extend over the entire surface area of the upper transparent wafer 510 and lower transparent wafer 520.

Figure 6:
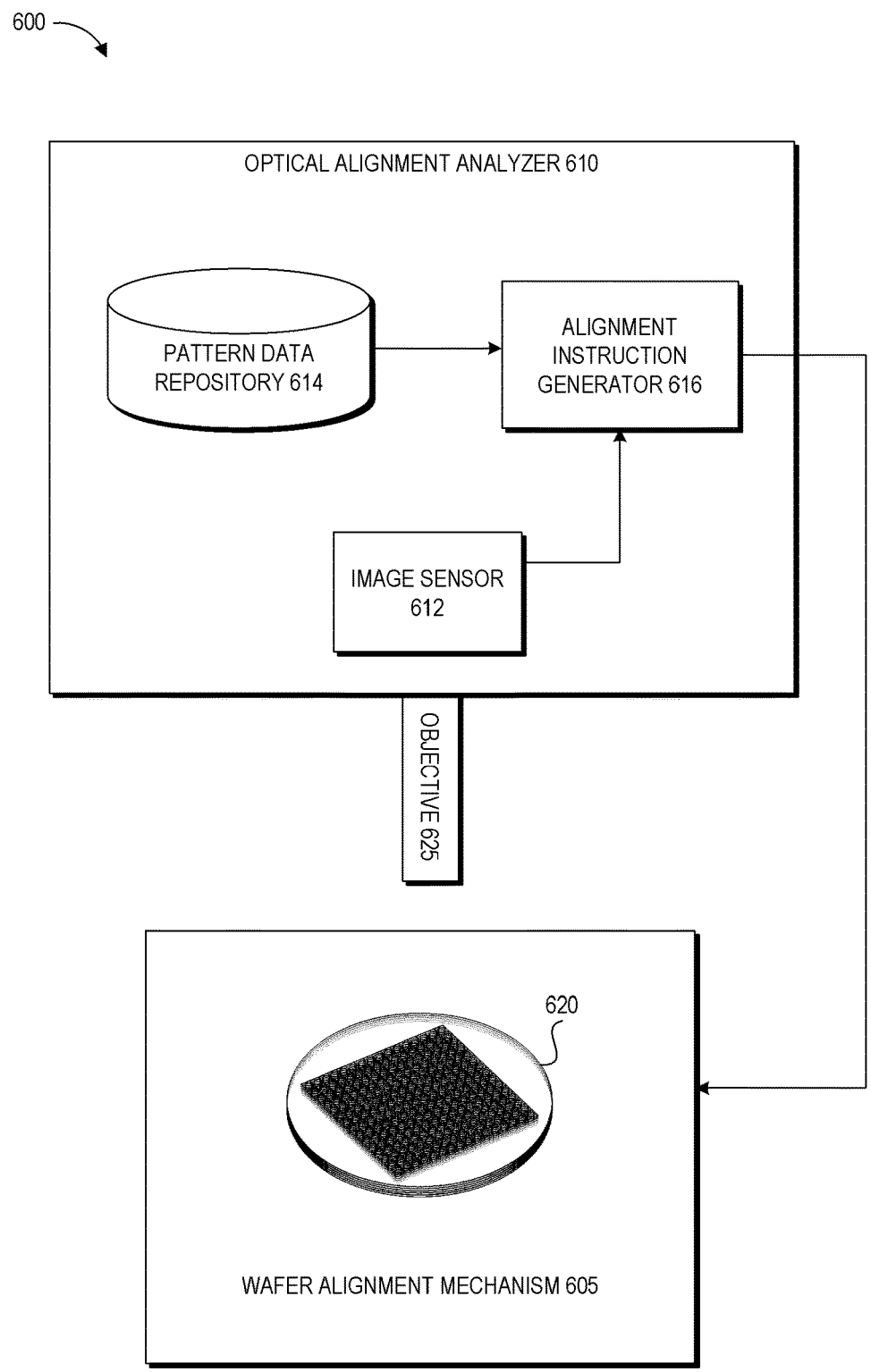
FIG. 6 illustrates a schematic block diagram of an alignment system that can perform automated alignment using the disclosed techniques.

FIG. 6 illustrates a schematic block diagram of an alignment system 600 that can perform automated alignment of any of the above-described wafer stacks using the disclosed beam splitter and/or high frequency pattern alignment features. The system 600 includes a wafer alignment mechanism 605, optical alignment analyzer 610, and one or more microscope objectives 625 positioned to view a wafer stack 620 on the wafer alignment mechanism 605.

The optical alignment analyzer 610 can include image sensor 612, pattern data repository 614, and alignment instruction generator 616. The image sensor 612 can be positioned to receive light representing the wafer stack 620 through the microscope objective 625. Where multiple objectives are used for simultaneous viewing of multiple alignment marker sets, a corresponding number of image sensors can be used.

The pattern data repository 614 can store a number of patterns produced by optimal alignment and various misalignments of the alignment markers on the wafers in the wafer stack 620.

The alignment instruction generator can compare data representing images captured by the image sensor 612 to data stored in the pattern data repository 614 to determine whether the wafers in the wafer stack 620 are properly aligned. For example, if the image of one or more sets of alignment markers on the wafer stack 620 does not match with a stored image of properly aligned markers, the alignment instruction generator can determined that the wafers in the wafer stack 620 require realignment. The specific pattern formed by the misaligned markers can indicate a vector for realignment that can be used as alignment instructions. The alignment instruction generator 616 can output the alignment instructions to the wafer alignment mechanism 605, which in turn can mechanically reposition some or all of the wafers in the wafer stack 620 individually until proper alignment is achieved.

After making a determination of proper alignment, the optical alignment analyzer can output a signal that the wafers should be bonded, for example by a lamination process or an optically clear adhesive or resin.

Implementing Systems and Terminology

Implementations disclosed herein provide systems, methods and apparatus for submicron wafer alignment. One skilled in the art will recognize that these embodiments may be implemented in hardware, software, firmware, or any combination thereof.

Information and signals disclosed herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, and algorithm steps described in connection with the embodiments disclosed herein may be implemented as electronic hardware, computer software, or combinations of both. To clearly illustrate this interchangeability of hardware and software, various illustrative components, blocks, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The techniques described herein may be implemented in hardware, software, firmware, or any combination thereof. Such techniques may be implemented in any of a variety of devices such as general purposes computers, wireless communication device handsets, or integrated circuit devices having multiple uses including application in wireless communication device handsets and other devices. Any features described as devices or components may be implemented together in an integrated logic device or separately as discrete but interoperable logic devices. If implemented in software, the techniques may be realized at least in part by a computer-readable data storage medium comprising program code including instructions that, when executed, performs one or more of the methods described above. The computer-readable data storage medium may form part of a computer program product, which may include packaging materials. The computer-readable medium may comprise memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

Processor(s) in communication with (e.g., operating in collaboration with) the computer-readable medium (e.g., memory or other data storage device) may execute the instructions of the program code, and may include one or more processors, such as one or more digital signal processors (DSPs), general purpose microprocessors, an application specific integrated circuits (ASICs), field programmable logic arrays (FPGAs), or other equivalent integrated or discrete logic circuitry. Such a processor may be configured to perform any of the techniques described in this disclosure. A general purpose processor may be a microprocessor; but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein. In addition, in some aspects, the functionality described herein may be provided within dedicated software or hardware configured for imaging, encoding, and/or decoding. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, or units are described in this disclosure to emphasize functional aspects of devices configured to perform the disclosed techniques, but do not necessarily require realization by different hardware units. Rather, as described above, various units may be combined in a codec hardware unit or provided by a collection of inter-operative hardware units, including one or more processors as described above, in conjunction with suitable software and/or firmware.

As used herein, the term "plurality" denotes two or more. For example, a plurality of components indicates two or more components. Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

Headings are included herein for reference and to aid in locating various sections. These headings are not intended to limit the scope of the concepts described with respect thereto. Such concepts may have applicability throughout the entire specification.

Although the foregoing has been described in connection with various different embodiments, features or elements from one embodiment may be combined with other embodiments without departing from the teachings of this disclosure. However, the combinations of features between the respective embodiments are not necessarily limited thereto. Various embodiments of the disclosure have been described. These and other embodiments are within the scope of the following claims.

What is claimed is:

1. An optical wafer stack comprising:
a first transparent wafer comprising a first array of lenses;
a second transparent wafer comprising a second array of lenses, each lens of the second array of lenses forming a lens pair with a corresponding one of the first array of lenses;
a first spacer wafer positioned between the first transparent wafer and the second transparent wafer and comprising a spacer material including an array of openings, at least one lens of each lens pair extending into an opening of the array of openings;
a first alignment mark provided on the first transparent wafer, the first alignment mark comprising a first set of repeating marks positioned around a first lens of the first array of lenses; and
a second alignment mark provided on the second transparent wafer, the second alignment mark comprising a second set of repeating marks complementary to the first set of repeating marks and positioned around a second lens of the second array of lenses, the first lens and the second lens forming one lens pair.

2. The optical wafer stack of claim 1, wherein the first set of repeating marks comprises a first set of concentric annuli and the second set of repeating marks comprises a second set of concentric annuli.

3. The optical wafer stack of claim 2, wherein, when the first alignment mark is aligned with the second alignment mark, the first and second sets of concentric annuli form a continuous circular shape when viewed from a top-down perspective orthogonal to a surface of the first transparent wafer.

4. The optical wafer stack of claim 1, wherein the first lens, the second lens, and a portion of the spacer material around an opening of the array of openings form a lens stack having an optical axis.

5. The optical wafer stack of claim 4, wherein, when the first alignment mark is aligned with the second alignment mark from a top-down perspective, a center of the first lens and a center of the second lens align with the optical axis of the lens stack within a tolerance of 2 microns.

6. The optical wafer stack of claim 4, further comprising a beam splitter layer provided at an optical center point between a first plane of the first alignment mark and a second plane of the second alignment mark.

7. The optical wafer stack of claim 6, wherein, when the first alignment mark is aligned with the second alignment mark from a top-down perspective, a center of the first lens and a center of the second lens align with the optical axis of the lens stack within a tolerance of 250 nm.

8. The optical wafer stack of claim 1, wherein the first set of repeating marks and the second set of repeating marks comprise concentric annuli having a line thickness of 5 µm.

9. The optical wafer stack of claim 1, further comprising:
a third transparent wafer including a third array of lenses;
a second spacer wafer positioned between the second transparent wafer and the third transparent wafer and comprising the spacer material including an array of openings; and
a third alignment mark provided on the third transparent wafer, the third alignment mark comprising a third set of repeating marks complementary to the first and second sets of repeating marks and positioned around a third lens of the third array of lenses, the third lens forming an optical stack with the first lens and the second lens.

10. The optical wafer stack of claim 1, further comprising:
a third transparent wafer including a third array of lenses;
a second spacer wafer positioned between the second transparent wafer and the third transparent wafer and comprising the spacer material including an array of openings;
a third alignment mark provided on the third transparent wafer, the third alignment mark comprising a third set of repeating marks positioned around a third lens of the third array of lenses, the third lens forming a pair with a fourth lens of the second array of lenses;
a fourth alignment mark provided on the second transparent wafer, the fourth alignment mark comprising a fourth set of repeating marks complementary to the third set of repeating marks and positioned around the fourth lens.

* * * * *